(12) United States Patent
Nishida et al.

(10) Patent No.: US 10,615,344 B2
(45) Date of Patent: Apr. 7, 2020

(54) VAPOR DEPOSITION MASK, METHOD OF MANUFACTURING THE SAME AND METHOD OF MANUFACTURING ORGANIC LIGHT EMITTING DIODE USING THE VAPOR DEPOSITION MASK

(71) Applicant: HON HAI PRECISION INDUSTRY CO., LTD., New Taipei (TW)

(72) Inventors: Koshi Nishida, Osaka (JP); Kozo Yano, Osaka (JP); Katsuhiko Kishimoto, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/073,100

(22) PCT Filed: Jul. 26, 2016

(86) PCT No.: PCT/JP2016/071853
§ 371 (c)(1),
(2) Date: Jul. 26, 2018

(87) PCT Pub. No.: WO2017/130440
PCT Pub. Date: Aug. 3, 2017

(65) Prior Publication Data
US 2019/0036025 A1    Jan. 31, 2019

(30) Foreign Application Priority Data
Jan. 26, 2016  (JP) .................................. 2016-012370

(51) Int. Cl.
*H01L 51/00* (2006.01)
*C23C 14/24* (2006.01)
(Continued)

(52) U.S. Cl.
CPC ........ *H01L 51/0011* (2013.01); *C23C 14/042* (2013.01); *C23C 14/24* (2013.01);
(Continued)

(58) Field of Classification Search
CPC .... H01L 51/0011; H01L 51/56; C23C 14/042
See application file for complete search history.

(56) References Cited

U.S. PATENT DOCUMENTS

2003/0150384 A1    8/2003  Baude et al.
2005/0191572 A1    9/2005  Baude et al.
(Continued)

FOREIGN PATENT DOCUMENTS

CN    1633518 A    6/2005
CN    101064354 A    10/2007
(Continued)

OTHER PUBLICATIONS

WO 2016/063810 (Year: 2015).*

*Primary Examiner* — Kyoung Lee
*Assistant Examiner* — Christina A Sylvia
(74) *Attorney, Agent, or Firm* — ScienBiziP, P.C.

(57) ABSTRACT

A vapor deposition mask used for forming a thin film pattern on a substrate enables to form much higher-definition thin film pattern and to closely attract and hold the vapor deposition mask to and on a surface of a transparent substrate by a magnetic force in a state that the substrate held on a substrate holder is intermediated therebetween, while preventing occurrence of shadow portions (vapor deposition shadows) to which no deposition material is adhered due to a holding member.

A vapor deposition mask 1 is composed of a single resin film layer 2 or a resin film layer 2 and a holding member 7 of a substantially rectangular thin plate frame body, and a metal powder 4 is contained in the resin film layer 2 in which a
(Continued)

plurality of through openings 3 are formed. When having the holding member 7, a single rectangular opening 8 including a portion of the resin film layer 2 where a plurality of the through openings 3 are formed is formed on the holding member 7.

8 Claims, 4 Drawing Sheets

(51) Int. Cl.
*H05B 33/10* (2006.01)
*C23C 14/04* (2006.01)
*H01L 51/50* (2006.01)
*H01L 51/52* (2006.01)
*H01L 51/56* (2006.01)

(52) U.S. Cl.
CPC ...... *H01L 51/5056* (2013.01); *H01L 51/5072* (2013.01); *H01L 51/5092* (2013.01); *H01L 51/5206* (2013.01); *H01L 51/5221* (2013.01); *H01L 51/56* (2013.01); *H05B 33/10* (2013.01)

(56) References Cited

U.S. PATENT DOCUMENTS

2015/0259780 A1\* 9/2015 Mizumura ............ C23C 14/042
427/555
2017/0311411 A1 10/2017 Takizawa et al.

FOREIGN PATENT DOCUMENTS

| JP | H05230618 A | 9/1993 |
|----|-------------|--------|
| JP | H0963834 A | 3/1997 |
| JP | H11-214154 A | 8/1999 |
| JP | 2001-237072 A | 8/2001 |
| JP | 2005-519187 A | 6/2005 |
| JP | 2005-302457 A | 10/2005 |
| JP | 2005302457 A | 10/2005 |
| JP | 2013-124372 A | 6/2013 |
| JP | 2014-98196 A | 5/2014 |
| JP | 2014-201819 A | 10/2014 |
| JP | 2014201819 A | 10/2014 |
| WO | 2016/063810 A1 | 4/2016 |

\* cited by examiner

VAPOR DEPOSITION MASK, METHOD OF MANUFACTURING THE SAME AND METHOD OF MANUFACTURING ORGANIC LIGHT EMITTING DIODE USING THE VAPOR DEPOSITION MASK

TECHNICAL FIELD

The present invention relates to a vapor deposition mask used for manufacturing an organic light emitting diode (OLED), for example, a method of manufacturing the same, and a method of manufacturing an organic light emitting diode using the vapor deposition mask.

BACKGROUND ART

An organic light emitting diode so-called bottom emission type structure is configured of a lamination of transparent electrodes (anodes), a hole injection layer, a hole transport layer, light emitting layers, an electron transport layer, an electron injection layer, metal electrodes (cathodes) and so on. In addition, in a top emission type one, reflective electrodes (anodes), a hole injection layer, a hole transport layer, light emitting layers, an electron transport layer, an electron injection layer, metal electrodes (cathodes) of semitransparent extremely thin and so on are laminated on a substrate made of a glass plate, a polyimide film of brownish-red or the like, which are not necessarily transparent. An apparatus of manufacturing a bottom emission type organic light emitting diode, which is general for industrially manufacturing the organic light emitting diode by vapor deposition, comprises a substrate holder for holding a transparent substrate, on which transparent electrodes are formed on a vapor deposition target surface, so that the vapor deposition target surface faces downward, a driving mechanism for rotating or translating the substrate holder or vapor deposition sources at a constant speed in a predetermined direction, and a plurality of point-like or linear vapor deposition sources provided so as to face the vapor deposition target surface of the transparent substrate held on the substrate holder in a bottom portion in a vacuum chamber. In each of a plurality of the vapor deposition sources, a deposition material for forming the hole injection layer, the hole transport layer, the light emitting layers, the electron transport layer, the electron injection layer, the metal electrodes, and so on is contained.

Vapor deposition masks corresponding to patterns of respective layers are prepared in the inside of the vacuum chamber used to deposit the materials of the above mentioned respective layers. For forming each layer, it is exchanged to a vapor deposition mask corresponding to the layer to be formed. In case of a full color organic light emitting diode without using a color filter, in order to deposit light emitting layers corresponding to colors of R (red), G (green) and B (blue), vapor deposition masks having openings corresponding to the patterns of respective colors are provided. When a light emitting layer of each color is formed, it is exchanged to a vapor deposition mask corresponding to the color. The vapor deposition mask needs to be closely attached to the vapor deposition target surface of the transparent substrate held on the substrate holder. The most common conventional vapor deposition mask is a metal mask having openings of a predetermined pattern formed thereon, and the substrate is closely attracted to and held on the vapor deposition target surface of the transparent substrate by a magnetic force of a magnet provided in the back side of the holder, that is, in the side opposite to the transparent substrate held on the substrate holder.

In order to make the openings much fine while maintaining the strength of the vapor deposition mask, as shown in FIG. 6, a conventional vapor deposition mask 110 described in Patent Literature 1 comprises a mask body portion 111 having a plurality of through openings 113, and a peripheral portion 112 having a thickness greater than a thickness of the mask body portion and having bottomed openings 114 larger than the through openings 113. The vapor deposition mask 110 is manufactured by the processes of forming a first resist pattern on a metal plate which has of the same sizes and arrangement pattern as those of a plurality of the through openings 113, forming a plurality of the through openings 113 on the metal plate by performing etching process via the through openings of the first resist pattern, removing the first resist pattern, forming a second resist pattern having a plurality of second through openings on the metal plate for exposing the metal edges of a predetermined width around a plurality of the through openings 113 respectively, and forming the bottomed openings 114 around a plurality of the though openings 113 by performing etching process via the second through openings of the second resist pattern. However, in the vapor deposition mask 110 manufactured by performing etching processes on such a metal plate, it is substantially impossible to form the through openings 113 uniformly on the entire surface of the vapor deposition mask 110 due to the occurrence of etching unevenness, for example, so that it was difficult to manufacture the vapor deposition mask corresponding to a high-definition thin film pattern more than 300 ppi, for example. In addition, since the vapor deposition materials are radially scattered from the vapor deposition sources, the inner shadows 115, that is, shadow portions where no vapor deposition material adheres, are formed due to the edge portions of the through openings 113 and the bottomed openings 114. Although, it is possible to deposit the deposition materials also on the initially shaded portions where no deposition material was adhered by rotating or translating the substrate holder, the thickness of the deposition materials adhering on the vapor deposition target surface become uneven.

On the other hand, in order to solve the problem of the vapor deposition mask manufactured by etching processes, as shown in FIG. 7, a conventional composite-type vapor deposition mask 120 described in Patent Literature 2 is manufactured by laminating a resin film layer 121 where a plurality of through openings 123 is formed and a holding member 122 made of a metal thin plate and holding the resin film layer 121 where a plurality of through openings 124 is formed. In the vapor deposition mask 120, a plurality of the through openings 124 which is larger in size than the thin film pattern to be formed on a transparent substrate is formed by performing etching process or the like to a magnetic metal plate previously, then, the resin film layer 12 is adhered on a surface of the holding member 122, and the through openings 123 corresponding to the thin film pattern are formed by irradiating laser beams on the resin film layer 121 via the through openings 124. In the vapor deposition mask 120, since the through openings 123 are formed by irradiating the laser beams on the resin film layer 121, it is possible to form a high-definition thin film pattern in comparison with the vapor deposition mask 110 formed by etching the metal plate. However, when it is attempted to form a much higher-definition thin film pattern, positional accuracy of the through openings 124 to be formed in the holding member 122 is required, and due to the positional deviation from the through openings 123 to be formed in the resin film layer 121, the inner shadows may be expanded, or the shapes of the inner shadows may become uneven.

Furthermore, in this conventional composite-type vapor deposition mask 120, subsequent to forming the resin film layer 121 by spreading a thermosetting resin on a surface of a glass substrate or the like and baking the same, the resin film layer 121 is temporarily removed and adhered on a surface of the holding member 122. Then, in order to form the through opening 123 by the laser beams, alcohol such as ethanol is spread on the surface of the glass plate, and the resin film layer 121 on the vapor deposition mask 120 is closely to the surface of the glass substrate by the surface tension of the alcohol again, so that it is difficult to attach the resin film layer 121 to the surface of the glass substrate without generating air bubbles. Here, in case of sublimating the resin material in the depth direction by irradiating the laser beams on the resin film layer 121, distribution also occurs in a speed for penetrated through the resin film layer 121 is depending on the in-plane distribution of energy. In consideration of forming one through opening, there are edges that can be quickly and slowly cut out among the edges of the four sides. At that time, when a bubble is interposed between the glass substrate and the resin film layer 121, a small piece, which invades into a gap formed by the bubble with the slowly cut side as the base point, occurs. The small piece is called burr. Therefore, there is a possibility that burrs are generated in the surroundings of the through openings 123 formed by irradiating the laser beams in the conventional vapor deposition mask 120. Generally, when the burr faces the opening, the burr serves as a barrier and causes the inner shadow, and when it does not face the opening, it causes a gap created between the deposition target substrate and the vapor deposition mask, and it causes the outer shadow which is adhesion of deposition materials adhere to places where the deposition material should not be adhered, essentially. In the following description, both of the inner shadow and the outer shadow are collectively referred as "vapor deposition shadow".

Alternatively, in order to prevent the vapor deposition shadows from enlarging due to the edge portions of the openings formed on the holding member, in a vapor deposition mask 130 described in Patent Literature 3, as shown in FIG. 8, a plurality of through openings 134 are formed by irradiating laser beams on a resin film formed of a lamination of a base layer 131 not containing a magnetic material, a magnetic layer 132 containing a magnetic material powder, and a protective layer 133. Since this vapor deposition mask 130 has no holding member, it is thinner than the vapor deposition mask 110 or 120 described in Patent Literature 1 or Patent Literature 2, so that the vapor deposition shadows can be made smaller, and, a much higher-definition thin film pattern can be formed. However, since the thickness of the magnetic layer 132 is thin, in a state where the transparent substrate held by the substrate holder is interposed, attraction force by a magnetic force of a magnet provided in the substrate holder is weak and the vapor deposition mask 130 may not be closely attracted to and held on the surface of the transparent substrate.

CITATION LIST

Patent Literatures

Patent Literature 1: JP 2001-237072 A
Patent Literature 2: JP 2013-124372 A
Patent Literature 3: JP 2014-201819 A

SUMMARY OF INVENTION

The present invention has been conceived to solve the problems of the above-mentioned background arts, and purposed to enable to form a much higher-definition thin film pattern in a vapor deposition mask used for forming a thin film pattern on a substrate, while preventing generation of vapor deposition shadows due to a holding member, and to provide a vapor deposition mask capable of being firmly and closely attracted to and held on a surface of a substrate by a magnetic force in a state where the substrate held by a substrate holder is interposed, and a method for manufacturing the same, and a method of manufacturing an organic light emitting diode using the vapor deposition mask.

In order to achieve the above-mentioned purposes, a vapor deposition mask according to the present invention is used for forming a thin film pattern on a substrate, the vapor deposition mask comprises a resin film layer containing a magnetic metal powder and having a plurality of through openings formed thereon.

It may comprise a holding member which is a frame body laminated on the resin film layer and has substantially the same outer shape as an outer shape of the resin film layer, wherein a single opening is formed in a portion including the portion of the resin film layer where a plurality of the through openings are formed.

The magnetic metal powder may be magnetized.

The resin film layer may be a polyimide resin, and the magnetic metal powder may be any one selected among iron, nickel, chromium, cobalt, neodymium, and samarium.

In addition, a method of manufacturing a vapor deposition mask according to the present invention comprises:

a step for spreading a thermosetting resin material obtained by mixing magnetic metal powders so as to be substantially uniform on a glass substrate;

a step for forming a resin film layer by burning the thermosetting resin material spread on a surface of the glass substrate to be coated; and a step for forming through openings sequentially in a predetermined region of the resin film layer by disposing a mask for laser processing above the resin film layer formed on the surface of the glass substrate to be coated, and irradiating laser beams while the mask for laser processing is moved step-by-step relative to the resin film layer.

The method may further comprise a step for irradiating ultraviolet laser beams from the glass surface side of the glass substrate so as to burn off an interface between the glass substrate and the resin film layer and to peel off the resin film layer from the glass substrate, subsequent to forming the through openings in entire area of the predetermined region of the resin film layer formed on the surface of the glass substrate to be coated.

Alternatively, the method may further comprise a step for laminating a holding member on the resin film layer formed on the surface of the glass substrate to be coated in a region other than the predetermined region, a step for irradiating ultraviolet laser beams from the glass surface side of the glass substrate so as to burn off an interface between the glass substrate and the resin film layer and to peel off the resin film layer from the glass substrate, subsequent to forming the through openings in entire area of the predetermined region of the resin film layer formed on the surface of the glass substrate to be coated, and a step for peeling the resin film layer from the glass substrate.

Furthermore, the method may comprise a step for magnetizing the magnetic metal powder contained in the resin film layer and the holding member when the holding member is provided, prior to or subsequent to the step for irradiating the ultraviolet laser beams from the glass surface side of the glass substrate.

Furthermore, a method of manufacturing an organic light emitting diode according to the present invention using one of the vapor deposition masks described above, comprises:

a step for holding a substrate having anodes formed on a vapor deposition target surface thereof in a vacuum chamber with a substrate holder in a manner that the vapor deposition target surface faces downward;

a step for closely attracting and holding the vapor deposition mask to and on the vapor deposition target surface of the substrate by a magnetic force of a magnet provided in a side of the substrate holder apposite to the substrate; and a step for vaporizing a vapor deposition material from a vapor deposition source while rotating or translating the substrate holder holding the substrate and the vapor deposition mask or the vapor deposition source provided in a bottom portion of the vacuum chamber at a constant speed in a predetermined direction; wherein a hole injection layer, a hole transport layer, light emitting layers, an electron transport layer, an electron injection layer, and cathodes are formed on anodes of the substrate while exchanging the vapor deposition masks and the deposition materials.

Alternatively, a method for manufacturing an organic light emitting diode according to the present invention uses a vapor deposition mask manufactured by any one of the methods of manufacturing the vapor deposition mask described above, comprises:

a step for holding a substrate having anodes formed on a vapor deposition target surface thereof in a vacuum chamber with a substrate holder in a manner that the vapor deposition target surface faces downward;

a step for closely attracting and holding the vapor deposition mask to and on the vapor deposition target surface of the substrate by a magnetic force of a magnet provided in a side of the substrate holder opposite to the substrate; and a step for vaporizing a vapor deposition material from a vapor deposition source while rotating or translating the substrate holder holding the substrate and the vapor deposition mask or the vapor deposition source provided in a bottom portion of the vacuum chamber at a constant speed in a predetermined direction; wherein a hole injection layer, a hole transport layer, light emitting layers, an electron transport layer, an electron injection layer, and cathodes are formed on anodes of the substrate while exchanging the vapor deposition masks and the deposition materials.

In the vapor deposition mask according to the present invention, since the magnetic metal powder is contained substantially uniformly in the entire resin film layer, in comparison with the conventional vapor deposition mask described in Patent Literature 3, an attraction force by the magnetic force of the magnet provided in the substrate holder becomes strong even though the substrate held on the substrate holder intermediates, so that the vapor deposition mask can be firmly and closely attracted to and held on the surface of the substrate. Furthermore, the resin film layer is held with a holding member which is a substantially rectangular thin plate-shaped frame body so as to include a portion of the resin film layer where a plurality of the through openings are formed, handling of the vapor deposition mask becomes easy while preventing generation of the vapor deposition shadows due to the holding member. Furthermore, by magnetizing the magnetic metal powder itself, it is possible to enhance the attraction force by magnetism.

In addition, in the method of manufacturing a vapor deposition mask according to the present invention, a thermosetting resin material obtained by mixing a magnetic metal powder is spread on a glass substrate, and then the thermosetting resin material is burned to form a resin film layer, and in such a state, through openings are formed in a predetermined region of the resin film layer by irradiating laser beams without peeling the resin film layer temporarily. Therefore, even if air bubbles are present in the thermosetting resin material at the stage of spreading the thermosetting resin material on the glass substrate, the air bubbles will disappear in the burning process, so that there is no air bubble in the interface between the glass substrate and the resin film layer. Consequently, when the through openings are formed in the resin film layer by irradiating the laser beams, no burr is generated at the edges of the through openings even if distribution occurs in the speed for penetrating through the resin film layer.

Furthermore, in the manufacture of the organic light-emitting diode, by using any one of the vapor deposition masks described above, it is possible to closely attract and hold the vapor deposition mask to and on the deposition target surface of the substrate by the magnetic force of the magnet provided in the side opposite to the substrate of the substrate holder, without using the holding member, essentially. Therefore, occurrence of inner shadows caused by the holding member can be reduced. In addition, since the magnetic metal powder is contained in the resin film layer, the magnetic attraction force is stronger than that of the conventional vapor deposition mask having the magnetic layer, so that a gap is hardly formed between the vapor deposition target surface of the substrate and the vapor deposition mask, and thus, occurrence of the outer shadows caused by the gap can be reduced.

As described above, when burr faces the opening, it serves as a barrier and causes the inner shadow, and when burr does not face the opening, a gap is created between the deposition target substrate and the deposition mask, so that it causes the outer shadow. However, in the manufacture of the organic light emitting diode, by using the vapor deposition mask without burrs at the edges of the through openings manufactured by any one of the method for manufacturing a vapor deposition mask described above, it is possible to reduce the inner shadows and the outer shadows caused by the burrs.

DESCRIPTION OF INVENTION

Figure 1:
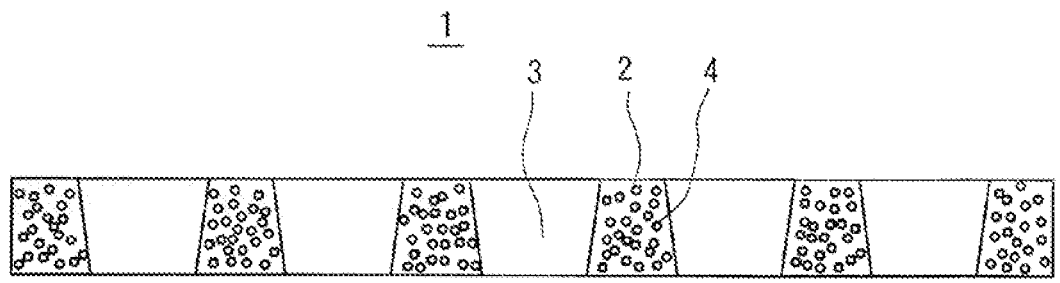
FIG. 1 is a cross-sectional view showing a basic configuration of a vapor deposition mask according to an embodiment of the present invention.

A vapor deposition mask according to an embodiment of the present invention, a method for manufacturing the same, and a method for manufacturing an organic light emitting diode using the vapor deposition mask will be described. FIG. 1 shows a basic configuration of a vapor deposition mask 1 according to the present embodiment. The vapor deposition mask 1 is used for forming a thin film pattern on a substrate, and a plurality of through openings 3 is formed in a resin film layer 2 containing a magnetic metal powder 4. The resin film layer 2 is formed by burning a mixture of polyimide resin and the magnetic metal powder 4 mixed to be substantially uniform, for example. A film thickness of the completed resin film is about 5 μm and the particle diameter of the magnetic metal powder 4 is about 0.5 μm, for example. From the viewpoint of making the vapor deposition shadow due to the edges of the through openings 3 be as small as possible, the thinner the resin film layer 2, the better. On the other hand, from the viewpoint of the strength of the resin film layer 2 and attracting and holding the magnetic metal powder 4 by the magnetic force, it is not preferable to make the film thickness of the resin film layer 2 too thin. As for the magnetic metal powder 4, iron, nickel, chromium, cobalt, neodymium, samarium, or the like can be used, for example.

Figure 2A:
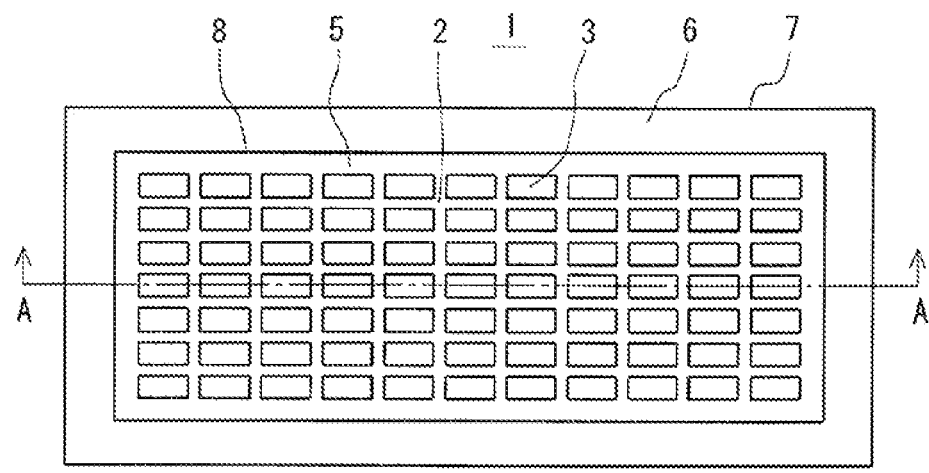
FIG. 2 (*a*) is a plan view showing a configuration of a modified example of the vapor deposition mask according to the embodiment, and FIG. 2 (*b*) is a cross sectional view taken along A-A line thereof.
Figure 2B:
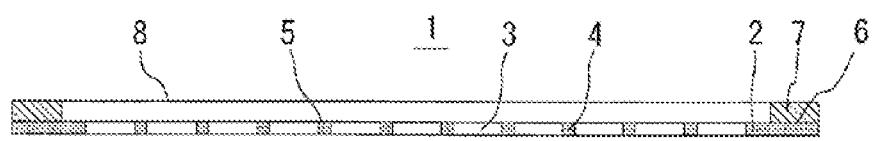

FIG. 2 shows a configuration of a modified example in which a bolding member 7 of a substantially rectangular thin plate-shaped frame body is laminated around the vapor deposition mask 1. A vapor deposition mask 1 according to this modified example comprises a resin film layer 2 formed with a plurality of through openings 3 and containing a magnetic metal powder 4, and the holding member 7 of the frame body laminated on the resin film layer 2 and having an outer shape substantially the same as the outer shape of the resin film layer 2, on which a single rectangular opening 8 including a portion of the resin film layer 2 where a plurality of the through openings 3 is formed is formed. Here, the portion of the resin film layer 2 where a plurality of the through openings 3 is formed is referred to as an "active region" 5, and the other portions are referred to as "inactive regions" 6. The holding member 7 may be made of a magnetic metal thin plate, for example.

As described above, the resin film layer 2 is extremely thin, and it is difficult to handle the resin film layer 2 as a single body. On the other hand, it is not preferable that the vapor deposition shadows are generated due to the openings of the holding member 7. Therefore, the holding member 7 has substantially the same outer shape as a deposition target surface of a deposition target substrate or the outer shape of the resin film layer 2 and is laminated on the resin film layer 2 in the inactive region 6, and a single opening 8 including the above active region 5 of the resin film layer 2 where a plurality of the through openings 3 is formed thereon.

Figure 3:
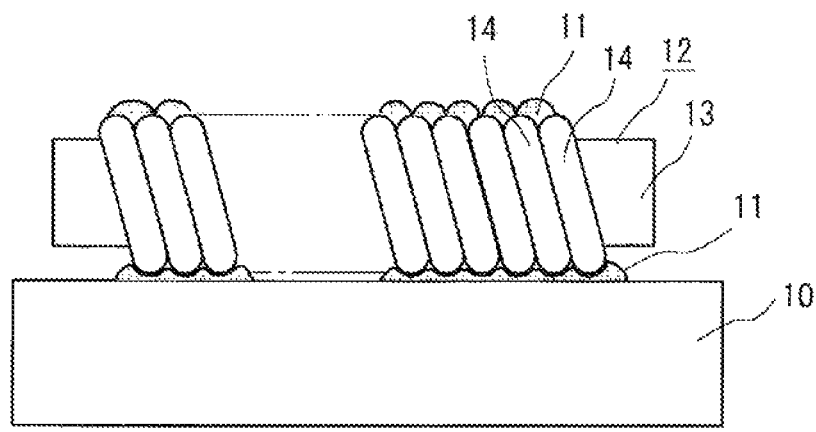
FIG. 3 is a view showing a method for spreading a resin material using a general wire bar coater type coating apparatus.

Subsequently, a method of manufacturing the vapor deposition mask according to an embodiment of the present invention will be described. FIG. 3 shows a method for spreading a resin material using a coating device 12 called a wire bar coater, generally. The coating apparatus 12 comprises a rotation shaft 13 which rotates parallel to a surface of a glass substrate 10 to be coated and a wire 14 which is closely wound around the rotation shaft 13, and a resin material 11 is supplied to an upper surface of the coating apparatus 12, for example. The resin material 11 supplied to the upper surface of the coating apparatus 12 is retained in recesses between the adjacent wires 14 by surface tension, and when the rotation shaft 13 rotates about a half turn, the resin material 11 is transferred (spread) to a surface of a glass substrate 10 to be coated. When the resin material 11 transferred to the surface of the glass substrate 10 to be coated leaves from the coating device 12, the thickness of the central portion thereof is made substantially constant due to the surface tension. The resin material 11 is a thermosetting resin such as polyimide and is burned at 400 to 500 degrees Celsius for several hours, for example. Since the solvent component is vaporized during, the film thickness of the formed resin film layer 2 depends on the solvent concentration, and it will be ½~⅓ of the film thickness of the resin material 11 spread on the surface of the glass substrate 10 to be coated, for example. Therefore, the amount and concentration of the resin material 11 to be coated on the surface of the glass substrate 10 are adjusted corresponding to a desired thickness of the resin film layer 2. In addition, the method for spreading the resin material 11 is not limited to the method using the wire bar coater, and other coating apparatus such as a slit coater, a spin coater, or the like can be used.

Figure 4:
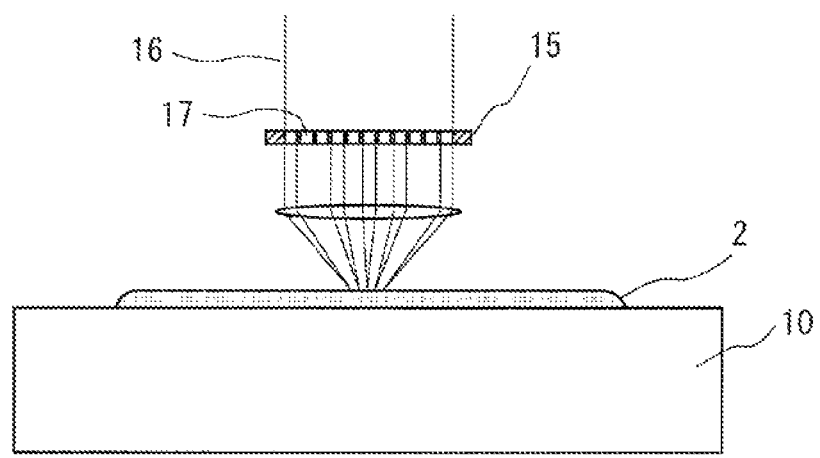
FIG. 4 is a view showing a process for forming through openings in a resin film layer by laser beams.

When the resin film layer 2 is formed on the surface of the glass substrate 10, a plurality of through openings 3 will be formed in the resin film layer 2 by irradiating laser beams in that situation. FIG. 4 shows a process for forming the through openings 3 in the resin film layer 2. A mask 15 for laser processing is placed above the resin film layer 2, and laser beams 16 converged by a condenser lens or the like are irradiated. The mask 15 for laser processing is manufactured by forming a metallic light shielding layer of chromium or the like on a transparent quartz glass and patterning the metallic light shielding layer by etching or the like, for example, and it has openings 17 for laser processing having similar figures of and large than the shapes and arrangement pattern of the through openings 3 to be formed on the resin film layer 2. The size of the mask 15 for laser processing is smaller than the size of the resin film layer 2, so that the through openings 3 are sequentially formed in the active region of the resin film layer 2 while moving the mask 15 for laser processing and the laser beams 16 relative to the resin film layer 2. Even if air bubbles are present in the resin material 11 at the stage where the resin material 11 is spread on the surface of the glass substrate 10, the bubbles will disappear in the burning process, so that no air bubble presents at the interface of the glass substrate 10 and the resin film layer 2. Consequently, when the through openings 3 are formed by irradiating the laser beams on the resin film layer 2, no burr is generated at the edge of the through openings 3 even if distribution occurs in the speed for penetrating through the resin film layer 2.

The size of the mask 15 for laser processing is 40 mm×40 mm, for example. In case of full high vision of 5.5 inch (400 ppi: pixel per inch), size of the through opening 3 formed in the resin film layer 2 is a rectangular shape of 30 μm×30 μm, for example. Also, in case of 4K of 5.5 inch (800 ppi), the through opening 3 becomes a rectangular shape of 15 μm×15 μm. In contrast, the size of the openings 17 for laser processing of the mask 15 for laser processing is 150 μm×150 μm, for example, when the magnification of the condensing lens is 10 times. The laser beams used for forming the through openings 3 in the resin film layer 2 has a wavelength of 355 nm, an energy of 0.36 J/cm$^2$, and a frequency of 60 Hz (60 pulses/second), and such laser pulses are irradiated 50 to 100 shots for one process of forming the opening, for example. When the through openings 3 are formed in the entire area of the active region 5 of the resin film layer 2 on the glass substrate 10, ultraviolet laser beams (not shown) are irradiated subsequently from the glass surface side of the glass substrate 10 using an excimer laser or the like having short wavelength so as to burn out the interface between the glass substrate 10 and the resin film layer 2 to make it easier to peel off the resin film layer 2 from the glass substrate 10. Alternatively, the holding member 7 may be laminated on the resin film layer 2 in a portion other than the active region 5 of the resin film layer 2 subsequent to the irradiation with the ultraviolet laser beams and prior to peeling off of the resin film layer 2 from the glass substrate 10.

Figure 5:
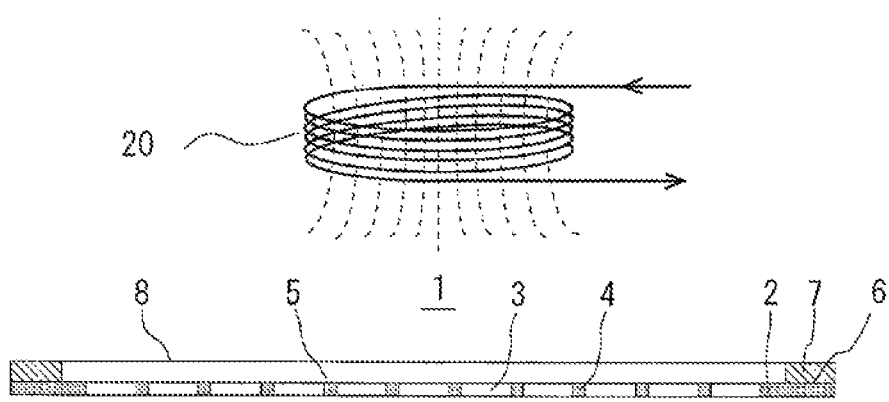
FIG. 5 is a view showing a process for magnetizing a magnetic metal powder or the like contained in the resin film layer, which is a modification of the vapor deposition mask according to the embodiment.
Figure 6:
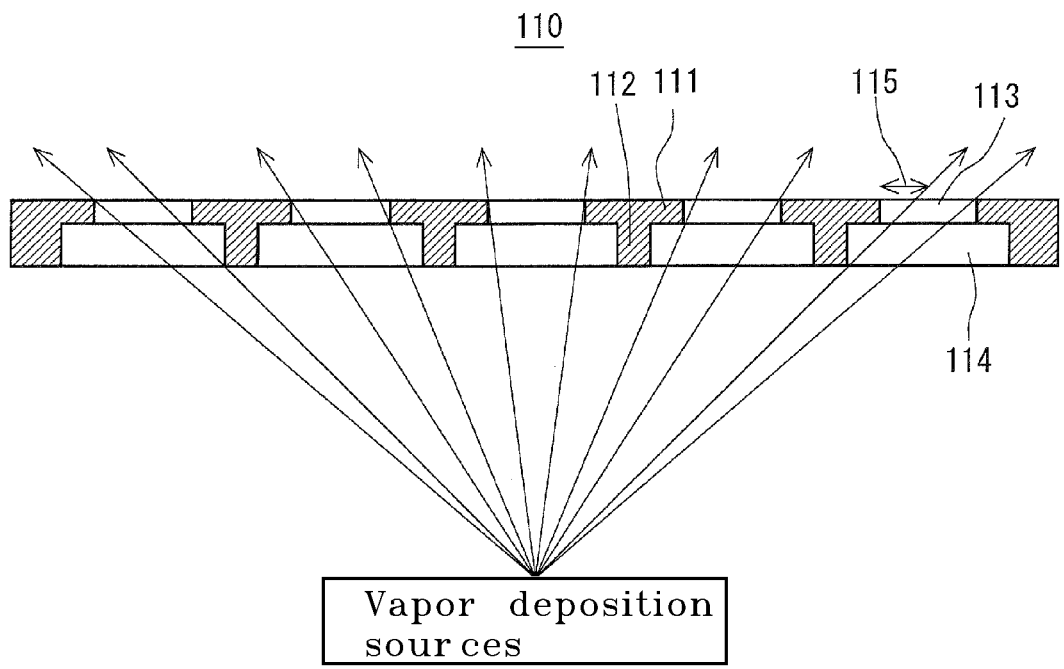
FIG. 6 is a cross-sectional view showing a configuration of a conventional vapor deposition mask.
Figure 7:
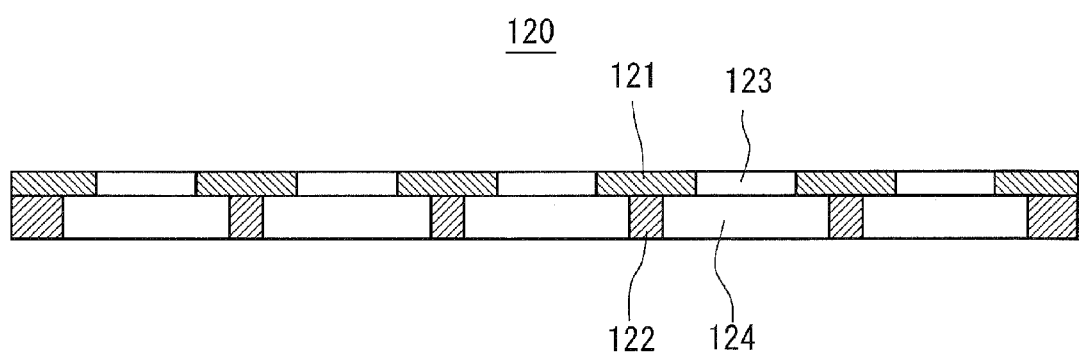
FIG. 7 is a cross-sectional view showing a configuration of another conventional vapor deposition mask.
Figure 8:
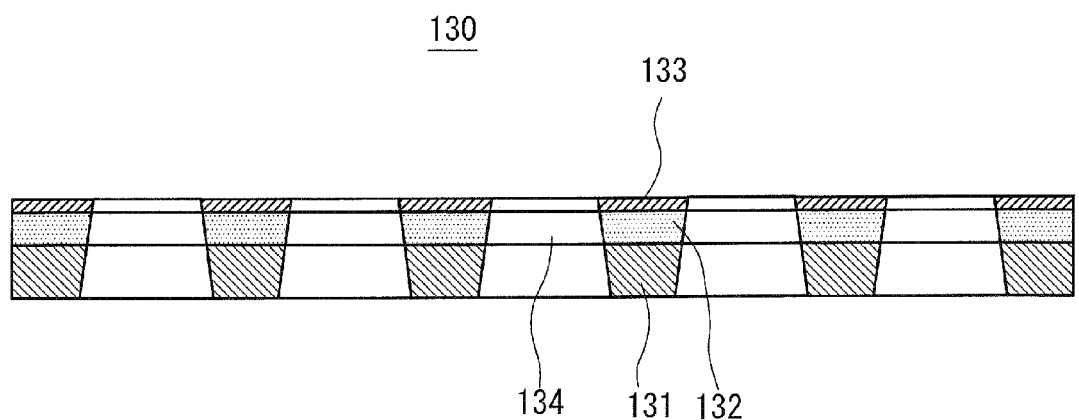
FIG. 8 is a cross-sectional view showing a configuration of still another conventional vapor deposition mask.

Alternatively, as another modified example of the vapor deposition mask 1 according to the present embodiment, as shown in FIG. 5, the magnetic metal powder 4 contained in the resin film layer 2 and the holding member 7 when the holding member 7 is provided may be magnetized by using an electromagnet device 20 or the like. It is needless to say that the direction of the magnetization is the same as the polarity of the magnet provided in the substrate holder used for vapor deposition. Thereby, it is possible to enhance the attraction force for attracting and holding them to and on the surface of the substrate by the magnetic force of the magnet provided in the substrate holder even when a substrate intermediates therebetween. In addition, it is preferable that the magnet provided in the substrate holder be an electromagnet so as to be switched the polarity. The process for magnetizing the magnetic metal powder 4 contained in the resin film layer 2 and the holding member 7 when the holding member 7 is provided may be carried out prior to or subsequent to the irradiation of the ultraviolet laser beams from the glass surface side of the glass substrate 10.

Subsequently, a method of manufacturing an organic light emitting diode using the vapor deposition mask according to the present invention will be described. The apparatus itself (not shown) used in the method of manufacturing the organic light emitting diode is the same as that conventionally and commonly used in the art. First, similar to the conventional method, a substrate having anodes formed on a deposition target surface thereof is held on a substrate holder in a vacuum chamber in a manner that its deposition target surface faces downward. Then, any one of the above mentioned the vapor deposition masks tor the vapor deposition mask 1 manufactured by any one of the methods described above is closely attracted to and held on the deposition target surface of the substrate by the magnetic force of the magnet provided in the opposite side of the substrate holder to the substrate. Essentially, the vapor deposition mask 1 can be closely attracted to and held on the deposition target surface of the substrate by the magnetic force of the magnet provided on the opposite side of the substrate holder to the substrate without using the holding member 7. Therefore, it is possible to reduce the occurrence of the vapor deposition shadows caused by the holding member 7. In addition, since the magnetic metal powder is substantially uniformly contained in the resin film layer 2, the magnetic attraction force is stronger than that of the conventional vapor deposition mask having the magnetic layer, and a gap is hardly formed between the deposition target surface of the substrate and the vapor deposition mask 1, so that it is possible to reduce the generation of the outer shadows caused by the gap. Furthermore, since no burr presents at the edges of the through openings 3 of the vapor deposition mask 1, the vapor deposition shadows and film blur due to burrs can be reduced. Thin film pattern of a vapor deposition material is formed on the deposition target surface of the substrate by depositing the vapor deposition material from the vapor deposition source or sources, while rotating or translating the substrate holder holding the substrate and the vapor deposition mask 1 or the vapor deposition source or sources provided in the bottom portion of the vacuum chamber at a constant speed in a predetermined direction. A hole injection layer, a hole transport layer, light emitting layers, an electron transport layer, an electron injection layer, and cathodes are formed on the anodes of the substrate while exchanging the vapor deposition masks 1 and the vapor deposition materials.

As described above, in the vapor deposition mask 1 according to the present invention, since a plurality of the through openings 3 are formed in the resin film layer 2 containing the magnetic metal powder 4, the resin film layer 2 can be attracted and held directly by the magnetic force of the magnet provided in the substrate holder of the vapor deposition apparatus without disposing the holding member made of a magnetic material such as a metal plate or the like. Therefore, a portion (deposition shadow) where no deposition material adheres due to the opening formed in the holding member is not formed, and it is possible to uniformly form a high-definition thin film pattern by using the deposition mask 1. Furthermore, by laminating the holding member 7, which is a substantially rectangular thin plate-like frame body, on the inactive region 6 other than the active region 5 where a plurality of through openings 3 are formed in the resin film layer 2, handling of the vapor deposition mask 1 becomes easier, and the attraction force to attract the vapor deposition mask 1 by the magnetic force of the magnet of the vapor deposition apparatus can be enhanced. In addition, by magnetizing the magnetic metal powder 4 and the holding member 7 when the holding member 7 is provided, it is possible to further enhance the attraction force of the magnet of the vapor deposition apparatus by which the vapor deposition mask 1 is attracted much more.

In the method of manufacturing a vapor deposition mask according to the present invention, since a thermosetting resin material obtained by mixing a magnetic metal powder is spread on a glass substrate, and then the thermosetting resin material is burned to form a resin film layer, and in such a state, through openings are formed in a predetermined region of the resin film layer by irradiating laser beams without peeling the resin film layer temporarily, when the through openings are formed in the resin film layer by irradiating the laser beams, no burr is generated at the edges of the through openings even if distribution occurs at a speed that the resin film layer is penetrated through.

Furthermore, in the manufacture of the organic light-emitting diode, by using the vapor deposition masks 1 in accordance the present invention, it is possible to closely attract and hold the vapor deposition mask 1 to and on the deposition target surface of the substrate by the magnetic force of the magnet provided in the opposite side to the substrate on the substrate holder, without using the holding member, essentially. Therefore, occurrence of inner shadows caused by the holding member can be reduced. In addition, since the magnetic metal powder 4 is contained in the resin film layer 2, the magnetic attraction force is stronger than that of the conventional vapor deposition mask having the magnetic layer, so that a gap is hardly formed between the vapor deposition target surface of the substrate and the vapor deposition mask 1, and thus, occurrence of the outer shadow caused by the gap can be reduced.

Still furthermore, by using the vapor deposition mask 1 without burrs at the edges of the through openings manufactured by the method of manufacturing a vapor deposition mask according to the present invention, inner shadows and outer shadows caused by burrs can be reduced.

REFERENCE SIGNS LIST

1: Vapor deposition mask
2: Resin film layer
3: Through openings
4: Magnetic metal powder
5: Active region (portion where a plurality of through openings are formed)
6: Inactive region (circumference of vapor deposition mask)
7: Holding member
8: Rectangular opening
10: Glass substrate
11: Resin material
12: Coating device
15: Mask for laser processing
16: Laser beams
17: Opening for laser processing
20: Electromagnet device

The invention claimed is:

1. A method of manufacturing a vapor deposition mask comprising:
 a step for spreading a thermosetting resin material obtained by mixing magnetic metal powders so as to be substantially uniform on a glass substrate;
 a step for forming a resin film layer by burning the thermosetting resin material spread on a surface of the glass substrate to be coated; and
 a step for disposing a mask for laser processing above the resin film layer formed on the surface of the glass substrate to be coated, and for forming through openings sequentially in a predetermined region of the resin film layer by irradiating laser beams while the mask for laser processing is moved step-by-step manner relative to the resin film layer.

2. The method of manufacturing a vapor deposition mask according to claim 1, further comprising a step for irradiating ultraviolet laser beams from the glass surface side of the glass substrate so as to burn off an interface between the glass substrate and the resin film layer and to peel off the resin film layer from the glass substrate, subsequent to forming the through openings in entire area of the predetermined region of the resin film layer formed on the surface of the glass substrate to be coated.

3. The method of manufacturing a vapor deposition mask according to claim 2, further comprising a step for magnetizing the magnetic metal powder contained in the resin film layer and the holding member when the holding member is provided, prior to or subsequent to the step for irradiating the ultraviolet laser beams from the glass surface side of the glass substrate.

4. A method for manufacturing an organic light emitting diode using a vapor deposition mask manufactured by the method of manufacturing the vapor deposition mask according to claim 2, characterized by comprising:
 a step for holding a substrate having anodes formed on a deposition target surface in a vacuum chamber with the substrate holder in a manner that the deposition target surface faces downward;
 a step for closely attracting and holding the vapor deposition mask to and on a vapor deposition target surface of the substrate by magnetic force of a magnet provided in a side of the substrate holder opposite to the substrate; and
 a step for vaporizing a vapor deposition material from a vapor deposition source while rotating or translating the substrate holder holding the substrate and the vapor deposition mask or the vapor deposition source provided in a bottom portion of the vacuum chamber at a constant speed in a predetermined direction; and wherein
 a hole injection layer, a hole transport layer, a light emitting layer, an electron transport layer, an electron injection layer, and cathodes are formed on the anodes of the substrate while exchanging the vapor deposition mask and the deposition material.

5. A method for manufacturing an organic light emitting diode using a vapor deposition mask manufactured by the method of manufacturing the vapor deposition mask according to claim 3, characterized by comprising:
 a step for holding a substrate having anodes formed on a deposition target surface in a vacuum chamber with the substrate holder in a manner that the deposition target surface faces downward;
 a step for closely attracting and holding the vapor deposition mask to and on a vapor deposition target surface of the substrate by magnetic force of a magnet provided in a side of the substrate holder opposite to the substrate; and
 a step for vaporizing a vapor deposition material from a vapor deposition source while rotating or translating the substrate holder holding the substrate and the vapor deposition mask or the vapor deposition source provided in a bottom portion of the vacuum chamber at a constant speed in a predetermined direction; and wherein
 a hole injection layer, a hole transport layer, a light emitting layer, an electron transport layer, an electron injection layer, and cathodes are formed on the anodes of the substrate while exchanging the vapor deposition mask and the deposition material.

6. The method of manufacturing a vapor deposition mask according to claim 1, further comprising a step for laminating a holding member on the resin film layer formed on the surface of the glass substrate to be coated in a region other than the predetermined region, and a step for irradiating ultraviolet laser beams from the glass surface side of the glass substrate so as to burn off an interface between the glass substrate and the resin film layer and to peel off the resin film layer from the glass substrate, subsequent to forming the through openings throughout the predetermined region of the resin film layer formed on the surface of the glass substrate to be coated.

7. The method of manufacturing a vapor deposition mask according to claim 6, further comprising a step for magnetizing the magnetic metal powder contained in the resin film layer and the holding member when the holding member is provided, prior to or subsequent to the step for irradiating the ultraviolet laser beams from the glass surface side of the glass substrate.

8. A method for manufacturing an organic light emitting diode using a vapor deposition mask manufactured by the method of manufacturing the vapor deposition mask according to claim 6, characterized by comprising:

- a step for holding a substrate having anodes formed on a deposition target surface in a vacuum chamber with the substrate holder in a manner that the deposition target surface faces downward;
- a step for closely attracting and holding the vapor deposition mask to and on a vapor deposition target surface of the substrate by magnetic force of a magnet provided in a side of the substrate holder opposite to the substrate; and
- a step for vaporizing a vapor deposition material from a vapor deposition source while rotating or translating the substrate holder holding the substrate and the vapor deposition mask or the vapor deposition source provided in a bottom portion of the vacuum chamber at a constant speed in a predetermined direction; and wherein
- a hole injection layer, a hole transport layer, a light emitting layer, an electron transport layer, an electron injection layer, and cathodes are formed on the anodes of the substrate while exchanging the vapor deposition mask and the deposition material.

\* \* \* \* \*